United States Patent
Takashige et al.

(10) Patent No.: US 9,728,590 B2
(45) Date of Patent: Aug. 8, 2017

(54) ORGANIC EL DEVICE

(71) Applicant: JOLED INC., Tokyo (JP)

(72) Inventors: Yumeji Takashige, Tokyo (JP); Nobuto Hosono, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/902,096

(22) PCT Filed: Jun. 23, 2014

(86) PCT No.: PCT/JP2014/003342
§ 371 (c)(1),
(2) Date: Dec. 30, 2015

(87) PCT Pub. No.: WO2015/001757
PCT Pub. Date: Jan. 8, 2015

(65) Prior Publication Data
US 2016/0372527 A1 Dec. 22, 2016

(30) Foreign Application Priority Data
Jul. 1, 2013 (JP) .................................. 2013-137951

(51) Int. Cl.
*H01L 27/32* (2006.01)
*H01L 51/00* (2006.01)
*H01L 51/52* (2006.01)
*H01L 51/56* (2006.01)
*H01L 51/50* (2006.01)

(52) U.S. Cl.
CPC ...... *H01L 27/3246* (2013.01); *H01L 27/3283* (2013.01); *H01L 51/0005* (2013.01);
(Continued)

(58) Field of Classification Search
CPC . H01L 51/0005; H01L 41/56; H01L 51/5253; H01L 2227/323;
(Continued)

(56) References Cited

U.S. PATENT DOCUMENTS

2005/0116632 A1 6/2005 Funamoto et al.
2009/0284144 A1 11/2009 Fujioka et al.
(Continued)

FOREIGN PATENT DOCUMENTS

JP 2004-119197 4/2004
JP 2005-326799 11/2005
(Continued)

OTHER PUBLICATIONS

International Search Report in International Patent Application No. PCT/JP2014/003342, dated Sep. 30, 2014.

*Primary Examiner* — Caridad Everhart
(74) *Attorney, Agent, or Firm* — Greenblum & Bernstein, P.L.C.

(57) ABSTRACT

An organic EL device including: a substrate; a bank layer having therewithin an opening having an elongated shape in plan view; and a functional layer including an organic material, disposed within the opening, and having an elongated shape in plan view. The bank layer includes first banks opposing each other with the functional layer therebetween in an transverse direction of the functional layer and extending along a longitudinal direction of the functional layer and second banks opposing each other with the functional layer therebetween in the longitudinal direction of the functional layer and extending along the transverse direction of the functional layer. An angle θ2 between an inclined surface of a second bank and an upper surface of the substrate is greater than an angle θ1 between an inclined surface of a first bank and the upper surface of the substrate.

8 Claims, 11 Drawing Sheets

(52) U.S. Cl.
CPC ...... *H01L 51/0018* (2013.01); *H01L 51/5012* (2013.01); *H01L 51/5056* (2013.01); *H01L 51/5072* (2013.01); *H01L 51/5088* (2013.01); *H01L 51/5218* (2013.01); *H01L 51/5221* (2013.01); *H01L 51/5253* (2013.01); *H01L 51/56* (2013.01); *H01L 2227/323* (2013.01); *H01L 2251/5315* (2013.01); *H01L 2251/558* (2013.01)

(58) Field of Classification Search
CPC ....... H01L 2251/5351; H01L 2251/558; H01L 27/3246; H01L 51/56; H01L 51/5221; H01L 51/5088; H01L 51/5012; H01L 51/5218; H01L 51/5056; H01L 27/3283
See application file for complete search history.

(56) References Cited

U.S. PATENT DOCUMENTS

| | | | |
|---|---|---|---|
| 2011/0187267 A1* | 8/2011 | Yamamoto | G02B 5/201 |
| | | | 313/504 |
| 2011/0198990 A1* | 8/2011 | Yoshida | H01L 27/3211 |
| | | | 313/504 |
| 2012/0193658 A1 | 8/2012 | Matsushima | |
| 2012/0313509 A1 | 12/2012 | Takagi et al. | |

FOREIGN PATENT DOCUMENTS

| | | |
|---|---|---|
| JP | 2009-277590 | 11/2009 |
| JP | 2012-129086 | 7/2012 |
| JP | 2012-256587 | 12/2012 |
| WO | 2012/049719 | 4/2012 |

\* cited by examiner

FIG. 7

| Sample No. | Angle [°] | | Thickness of organic light-emitting layer [nm] | |
|---|---|---|---|---|
| | $\theta_1$ | $\theta_2$ | First end portion | Second end portion |
| 1 | 30.0 | 20.0 | 100 | 30 |
| 2 | 37.7 | 26.6 | 110 | 50 |
| 3 | 51.8 | 41.6 | 120 | 70 |
| 4 | 54.3 | 48.0 | 125 | 100 |
| 5 | 61.8 | 54.0 | 150 | 110 |

ORGANIC EL DEVICE

TECHNICAL FIELD

The present disclosure relates to an organic electroluminescence (EL) device including an organic EL element. An organic EL element of the present disclosure includes a functional layer formed by applying and drying an ink including an organic material.

BACKGROUND ART

An organic EL element is a current-driven light-emitting element. In a typical organic EL element, a functional layer including an organic material is disposed between a pair of electrodes consisting of an anode and a cathode. An organic light-emitting layer and, as necessary, a hole transport layer, etc., may be included in the functional layer. When a voltage is applied between the pair of electrodes of the organic EL element, holes injected from the anode to the organic light-emitting layer and electrons injected from the cathode to the organic light-emitting layer recombine in the organic light-emitting layer. An electroluminescent phenomenon occurs because of the recombination of the holes and the electrons, and causes the organic light-emitting layer to emit light. Also, an organic EL element has high visibility because of its self-luminous characteristic. Further, an organic EL element is a solid element and therefore has excellent impact resistance. Accordingly, organic EL devices including a plurality of organic EL elements, such as displays, are developed recently.

Meanwhile, in a typical organic EL display device including a plurality of pixels, three subpixel regions, each having an elongated shape, constitute one pixel. The three subpixel regions correspond to red (R), green (G), and blue (B), respectively. A functional layer of each of the subpixel regions is formed by, for instance, ink application in which an ink including an organic material and a solvent is applied by utilizing an ink jet device. First, a bank layer having an opening therewithin is formed on a substrate by ink application. The opening is provided for forming a functional layer. Then, an ink including an organic material is applied to the opening and is dried. In this manner, a functional layer of a subpixel region is formed within the opening (see, for instance, Patent Literature 1).

CITATION LIST

Patent Literature

[Patent Literature 1]
Japanese Patent Application Publication No. 2004-119197

SUMMARY OF INVENTION

One aspect of the present disclosure provides a highly reliable organic EL device that includes a functional layer having an elongated shape in plan view and formed by ink application.

An organic electroluminescence (EL) device pertaining to one aspect of the present disclosure includes: a substrate; a bank layer disposed on the substrate and having therewithin an opening, the opening, in plan view, having a shorter length in a first direction than in a second direction, and the first direction and the second direction crossing each other; and a functional layer disposed within the opening and containing an organic material, the functional layer, in plan view, having a shorter length in the first direction than in the second direction. In the organic EL device, the bank layer includes: two first banks opposing each other in the first direction with the functional layer therebetween and extending along the second direction; and two second banks opposing each other in the second direction with the functional layer therebetween and extending along the first direction, inner wall surfaces of the first banks and the second banks surround the functional layer and define the opening, each of the inner wall surfaces being inclined, and the inclined inner wall surface of each of the second banks forms an angle $\theta 2$ with an upper surface of the substrate, and each of the inclined inner wall surfaces of the first banks forms an angle $\theta 1$ smaller than the angle $\theta 2$ with the upper surface of the substrate.

Meanwhile, each general or specific aspect of the present disclosure may be implemented using an organic EL element, an electronic device, a system, or a manufacturing method/or any combination of an organic EL element, an electronic device, a system, and a manufacturing method.

BRIEF DESCRIPTION OF DRAWINGS

FIG. 7 illustrates a table indicating, for each of organic EL devices utilized for experiments, an angle between an inclined surface of a first bank and an upper surface of a substrate, an angle between an inclined surface of a second bank and the upper surface of the substrate, and thicknesses of end portions of a functional layer.

FIG. 8A indicates results when the angle between the inclined surface of the second bank and the upper surface of the substrate was 30.0°, and FIG. 8B indicates results when the angle between the inclined surface of the second bank and the upper surface of the substrate was 61.8°.

FIG. 9A indicates the results when the angle between the inclined surface of the first bank and the upper surface of the substrate was 20.0°, and FIG. 9B indicates the results when the angle between the inclined surface of the first bank and the upper surface of the substrate was 54.0°.

DESCRIPTION OF EMBODIMENTS

Figure 1:
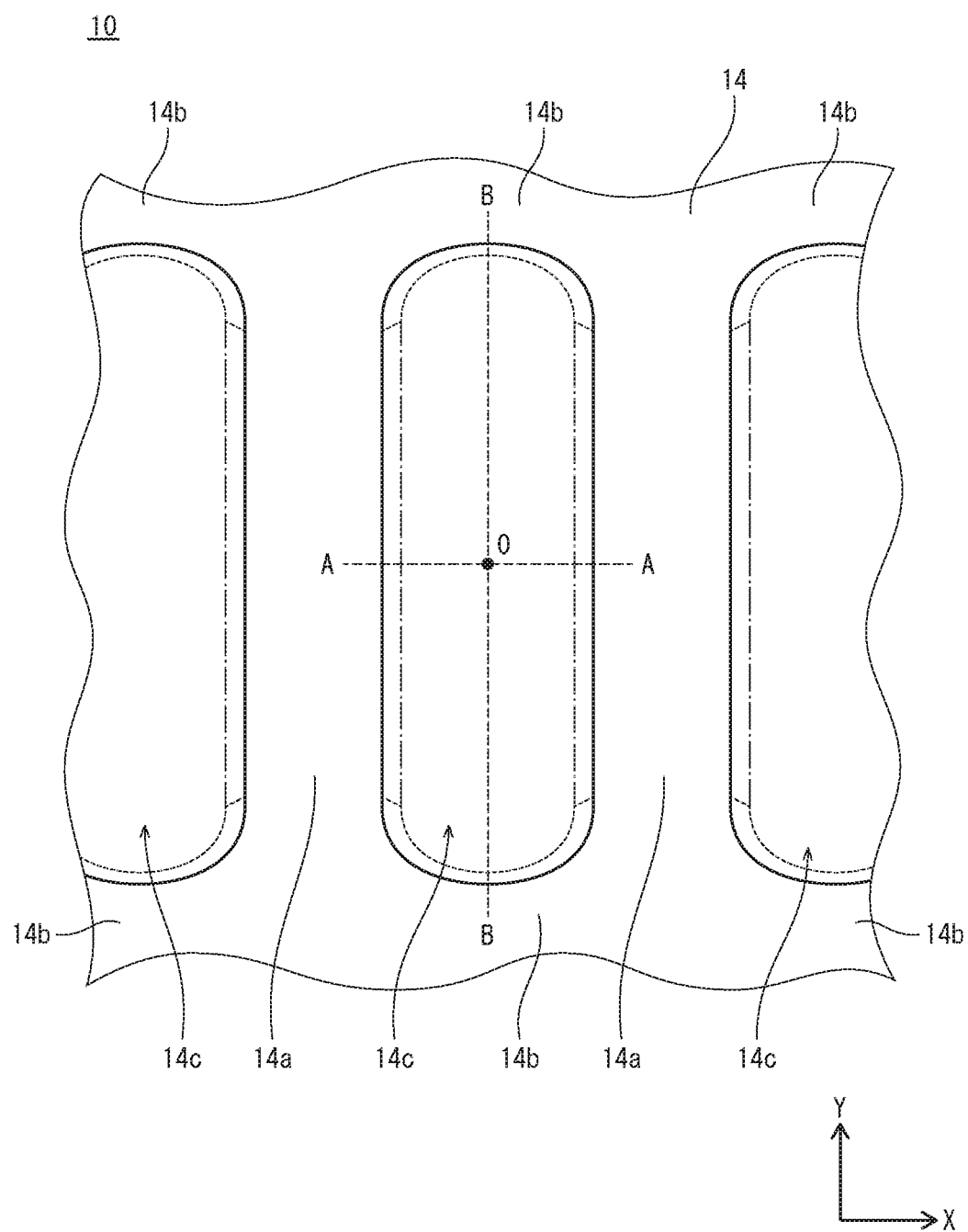
FIG. 1 illustrates a layout of an upper surface of a bank layer in an organic EL device pertaining to embodiment 1.

Process by which One Aspect of Present Invention was Achieved

One typical method for forming a functional layer of an organic EL device is ink application. When ink application is utilized for forming a functional layer of an organic EL device, an ink including an organic material is applied to an opening disposed within a bank layer and the ink is dried. In order to improve light emission efficiency of an organic EL device having a functional layer formed by ink application, the inventors of the present application examined a relationship between the structure and the light emission efficiency of an organic EL device.

An opening of a bank layer used for ink application typically has a taper shape, so as to hold therein an ink including an organic material. That is, a lateral surface of the bank layer that faces the opening is inclined. Typically, the angle between the inclined lateral surface and an upper surface of a substrate is the same at all regions of the bank layer facing the opening.

Typically, the inclined lateral surface of the bank layer is not entirely planar. In one typical case, the inclined lateral surface of the bank layer is curved at a lower position, planar at a central position, and curved at a higher position, along a height direction of the bank layer. In this case, the angle between the inclined surface of the bank layer and the upper surface of the substrate refers to angles measured at the planar region at the central position of the inclined lateral surfaces in the height direction.

Further, in order to form an elongated subpixel region, the opening of the bank layer is formed in an elongated shape. Here, each of two portions of the bank layer opposing each other in a transverse direction of the functional layer with the functional layer therebetween and extending along a longitudinal direction of the functional layer is hereinafter referred to as a "first bank". Also, each of two portions of the bank layer opposing each other in the longitudinal direction of the functional layer with the functional layer therebetween and extending along the transverse direction of the functional layer is hereinafter referred to as a "second bank".

The inventors of the present application examined an organic EL device as described above having a functional layer formed within an elongated opening of a bank layer by utilizing ink application. As a result, the inventors have newly found that thickness of an end portion of the functional layer near the first bank was greater than thickness of an end portion of the functional layer near the second bank. The inventors of the present application further examined the cause of such difference in thickness of the end portions of the functional layer.

When an ink is applied to an elongated opening of a bank layer, surface tension of the ink tends to cause the surface of the applied ink to have a spherical shape. Further, typically, when an ink is applied to an opening of a bank layer, the ink is applied to the center of the opening. In such cases, the applied ink first reaches the first banks, and then reaches the second banks. Within the time period from arrival of the ink at the first banks to arrival of the ink at the second banks, the solvent included in the ink gradually evaporates. Because of this, a pinning position of the ink on the first bank is higher than a pinning position of the ink on the second bank. As a result, the thickness of the end portion of the functional layer near the first bank is greater than the thickness of the end portion of the functional layer near the second bank. Meanwhile, a pinning position of an ink on each of the first bank and the second bank refers to the highest position on the inclined surface of the bank among positions of the inclined surface that comes in contact with the ink within the time period from arrival of the ink at the inclined surfaces of the first banks to completion of the drying of the solvent of the ink.

In view of this, the inventors of the present application considered that the difference in thickness between the end portion of the functional layer near the first bank and the end portion of the functional layer near the second bank may be suppressed by controlling the time period from ink application to the arrival of the ink at the first banks and the time period from ink application to arrival of the ink at the second banks. One possible method for executing such a control is, for instance, to change the ratio of the length of the opening within the bank layer in the transverse direction to the length of the opening in the longitudinal direction. However, such a configuration is difficult to realize, because an organic EL device needs to have a light-emitting region of a certain size. Therefore, the inventors of the present application have focused on an angle between the inclined surface of the first bank and the upper surface of the substrate and an angle between the inclined surface of the second bank and the upper surface of the substrate. One aspect of the present application has been obtained as such.

As described above, when a functional layer having an elongated shape in plan view is formed by ink application, the thickness of the end portion of the functional layer near the first bank sometimes unfortunately is different from the thickness of the end portion of the functional layer near the second bank. When such a difference is present, for instance, current is concentrated at regions of the functional layer with relatively small thickness. This causes, for instance, the light emission efficiency and light-emitting life of the organic EL device to unfortunately deteriorate.

One aspect of the present disclosure provides an organic EL device suppressing the difference between the thickness of the end portion of the functional layer near the first bank and the thickness of the end portion of the functional layer near the second bank, when the functional layer has an elongated shape in plan view and is formed by ink application.

In an organic EL device pertaining to one aspect of the present disclosure, an angle θ2 between an inclined surface of each of the second banks opposing each other in the longitudinal direction of the functional layer with the functional layer therebetween and the upper surface of the substrate is greater than an angle θ1 between an inclined surface of each of first banks opposing each other in the transverse direction of the functional layer with the functional layer therebetween and the upper surface of the Substrate.

This can suppress the difference between the thickness of the end portion of the functional layer near the first bank and the thickness of the end portion of the functional layer near the second bank, when the functional layer has an elongated shape in plan view and is formed by ink application.

The following is a description of an organic EL device pertaining to one aspect, followed by results of experiments for checking performances of the aspect and analysis of the experiment results. Meanwhile, members in the drawings are not necessarily drawn in the same scale as ones in the actual organic EL devices.

[Overview of One Aspect]

An organic electroluminescence (EL) device pertaining to one aspect of the present disclosure includes: a substrate; a bank layer disposed on the substrate and having therewithin an opening, the opening, in plan view, having a shorter length in a first direction than in a second direction, and the first direction and the second direction crossing each other; and a functional layer disposed within the opening and containing an organic material, the functional layer, in plan view, having a shorter length in the first direction than in the second direction. In the organic EL device, the bank layer includes: two first banks opposing each other in the first direction with the functional layer therebetween and extending along the second direction; and two second banks opposing each other in the second direction with the functional layer therebetween and extending along the first direction, inner wall surfaces of the first banks and the second banks surround the functional layer and define the opening, each of the inner wall surfaces being inclined, and the inclined inner wall surface of each of the second banks forms an angle θ2 with an upper surface of the substrate, and each of the inclined inner wall surfaces of the first banks forms an angle θ1 smaller than the angle θ2 with the upper surface of the substrate.

Further, in the organic EL device, the angle θ1 and the angle θ2 may satisfy:

$$(0.6582\times\theta 1+23.6000)\leq\theta 2\leq(0.6582\times\theta 1+32.0100). \quad \text{[Math 1]}$$

Further, in the organic EL device, when thickness of the functional layer at a position nearer one of the first banks than a center of the functional layer between the first banks is $T_1$ nm, the angle θ1 and the angle θ2 may satisfy:

$$(\theta 1+(34.0196-0.2188\times T_1))\leq\theta 2\leq(\theta 1+(42.4456-0.2188\times T_1)). \quad \text{[Math 2]}$$

Further, in the organic EL device, the organic material may be a hole transport material.

Further, in the organic EL device, the first banks and the second banks may be formed by a photolithography utilizing one of a halftone mask, a gray tone mask, and a slit mask.

Further, in the organic EL device, the functional layer may be formed by applying and drying an ink containing the organic material.

EMBODIMENT

Embodiment 1

1. Overall Configuration

Figure 2:
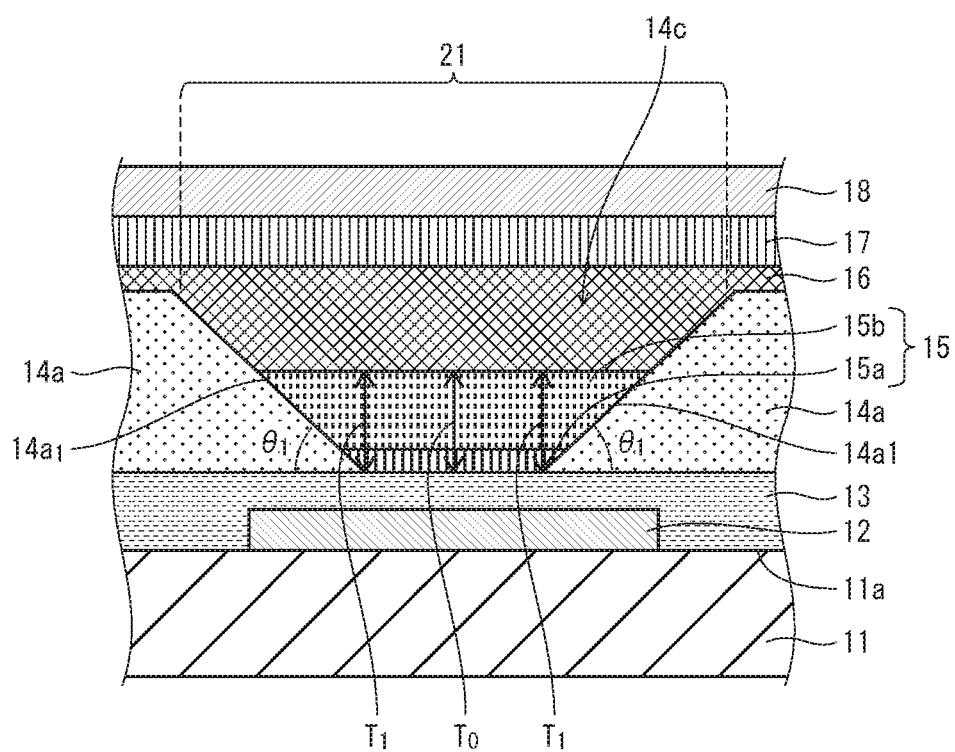
FIG. 2 is a cross-sectional view illustrating an overall configuration of the organic EL device illustrated in FIG. 1, taken along line A-A.
Figure 2:
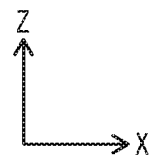
Figure 3:
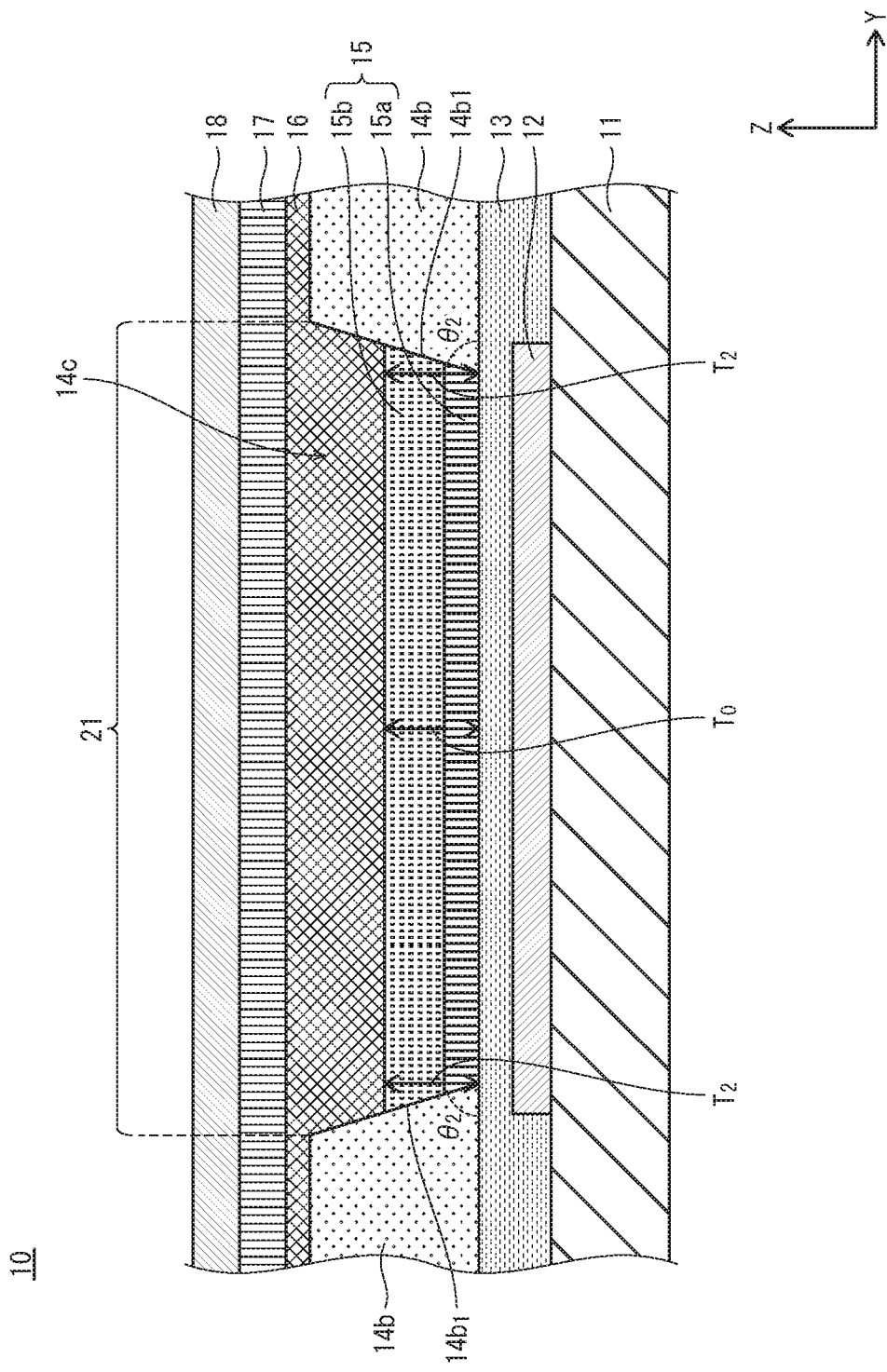
FIG. 3 is a cross-sectional view illustrating an overall configuration of the organic EL device illustrated in FIG. 1, taken along line B-B.

Utilizing FIG. 1, FIG. 2, and FIG. 3, the following describes a configuration of an organic EL device 10. FIG. 1 illustrates a top view of a bank layer 14 of the organic EL device 10. FIG. 2 and FIG. 3 illustrate an overall configuration of the organic EL device 10. FIG. 2 is a cross-sectional view of the bank layer 14 of the organic EL device 10 illustrated in FIG. 1, taken along line A-A. FIG. 3 is a cross-sectional view of the bank layer 14 of the organic EL device 10 illustrated in FIG. 1, taken along line B-B.

As illustrated in FIG. 1, the bank layer 14 has first banks 14a that extend along a longitudinal direction of elongated openings 14c. The bank layer 14 also has second banks 14b that extend along a transverse direction of the openings 14c. The openings 14c are arranged along an X-direction at certain intervals. Subpixel regions are formed within the openings 14c in one-to-one correspondence, by disposing a functional layer, etc., therewithin. Each of adjacent subpixel regions corresponds to one of the colors red (R), blue (B), and green (G). A combination of three subpixel regions respectively corresponding to R, G, and B constitutes one pixel. Meanwhile, the openings 14c are also arranged along a Y-direction at certain intervals (not illustrated). Accordingly, the openings 14c are arranged in the X-direction and the Y-direction so as to form a matrix.

Although the organic EL device 10 has a plurality of subpixel regions 21, a cross-sectional view corresponding to one of the subpixel regions 21 is illustrated in each of FIG. 2 and FIG. 3. As illustrated in FIG. 2 and FIG. 3, the organic EL device 10 includes a TFT substrate 11 (hereinafter simply referred to as "the substrate 11"), a reflective anode 12, the first banks 14a, the second banks 14b, a hole injection layer 13, a functional layer 15, an electron transport layer 16, a cathode 17, and a sealing layer 18. The functional layer 15 is disposed in the opening 14c, which is surrounded by the first banks 14a and the second banks 14b. Further, the functional layer 15 includes a hole transport layer 15a and an organic light-emitting layer 15b.

The reflective anode 12 is disposed on the substrate 11. Returning to FIG. 1, a pair of first banks 14a oppose each other in a transverse direction of the functional layer 15 with the functional layer 15 therebetween, and extend along a longitudinal direction of the functional layer 15. A pair of second banks 14b oppose each other in the longitudinal direction of the functional layer 15 with the functional layer 15 therebetween, and extend along the transverse direction of the functional layer 15. Here, the transverse direction of the functional layer 15 refers to the X-direction illustrated in FIG. 1, and the longitudinal direction of the functional layer 15 refers to the Y-direction illustrated in FIG. 1.

Returning to FIG. 2 and FIG. 3, one reflective anode 12 and one functional layer 15 are formed for each subpixel region 21. On the other hand, the hole injection layer 13, the electron transport layer 16, the cathode 17, and the sealing layer 18 are formed so as to cover all subpixel regions 21. In the organic EL device 10, the reflective anode 12 contains an electrically conductive material reflecting visible light, and the cathode 17 contains an electrically conductive material through which visible light passes. This enables the organic EL device 10 to be driven as a device of a top emission type in which the light produced in the organic light-emitting layer 15b is emitted to the outside of the organic EL device 10 from a side of the organic EL device 10 opposite the substrate 11. Meanwhile, an auxiliary wiring may be provided between the pixels so as to be in contact with the cathode 17. The auxiliary wiring may be provided for each pixel, or for each set of two or more pixels.

The following describes a configuration of components of the organic EL device 10.

2. Configuration of Components

[Substrate 11]

The substrate 11 is the base material of the organic EL device 10. The substrate 11 may include a substrate body and a thin film transistor (TFT) wiring unit disposed on an upper surface of the substrate body. The substrate body contains, for instance, an electrically insulating material. Examples of a material for the substrate body are alkali-free glass, soda glass, non-fluorescent glass, phosphate glass, nitrate-based glass, silica glass, acrylic-based resin, styrene-based resin, polycarbonate-based resin, epoxy-based resin, polyethyrene, polyester, silicone-based resin, alumina, and an organic resin film.

[Reflective Anode 12]

The reflective anode 12 is an electrode for providing holes to the organic light-emitting layer 15b. In plan view, the reflective anode 12 has an elongated shape. The reflective anode 12 is made of an electrically conductive material reflecting visible light. Accordingly, the reflective anode 12 is capable of reflecting light that is emitted to the outside of the organic EL device 10 from the organic light-emitting layer 15b and is incident on the reflective anode 12 so that the light is emitted to the outside of the organic EL device 10 from a side of the organic EL device 10 opposite the substrate 11. This can improve the light extraction efficiency of the organic EL device 10. The reflective anode 12 can be made of, for instance, aluminum (Al), aluminum alloy material, silver (Ag), or silver alloy material.

[Hole Injection Layer 13]

The hole injection layer 13 is disposed on the reflective anode 12. The hole injection layer 13 improves efficiency of injecting holes toward the organic light-emitting layer 15b. The hole injection layer 13 is made of, for instance, a light-transmissive thin film composed of a transition metal oxide. Examples of a transition metal oxide for the hole injection layer 13 are tungsten oxide (WOx) and molybdenum oxide (MoOx). Further, because the organic EL device 10 has a top emission structure, the hole injection layer 13 can be made of a material through which visible light passes. Composing the hole injection layer 13 with a material through which visible light passes can improve the light emission efficiency of the organic EL device 10 because the hole injection layer 13 allows visible light reflected at the reflective anode 12 to pass therethrough.

[Bank Layer 14]

The bank layer 14 is a structural body defining the subpixel region 21. The bank layer 14 has the first banks 14a, which oppose each other in the transverse direction of the functional layer 15 with the functional layer 15 therebetween and extending along the longitudinal direction of the functional layer 15. Also, the bank layer 14 has the second banks 14b, which oppose each other in the longitudinal direction of the functional layer 15 with the functional layer 15 therebetween and extending along the transverse direction of the functional layer 15.

The first bank 14a has an inclined surface 14a1 facing the functional layer 15. An angle θ1 between the inclined surface 14a1 of the first bank 14a and the upper surface of the substrate 11 is, for instance, 30.0°. The distance between edges of adjacent first banks 14a (first banks 14a opposing each other with the functional layer 15 therebetween) is, for instance, 64 µm.

The second bank 14b has an inclined surface 14b1 facing the functional layer 15. An angle θ2 between the inclined surface 14b1 of the second bank 14b and the upper surface of the substrate 11 is greater than the angle θ1 and, for instance, 48.0°. The distance between edges of adjacent second banks 14b (second banks 14b opposing each other with the functional layer 15 therebetween) is, for instance, 254 µm.

Meanwhile, the height of the bank layer 14 (height along a Z-direction in FIG. 2 and FIG. 3) is, for instance, 1 µm. Also, in FIG. 2, FIG. 3, and the drawings that follow FIG. 3, the thickness and the shape of each layer is schematically illustrated.

The bank layer 14, for instance, is liquid-repellent and contains a light-transmissive electrically insulating material. Further, the bank layer 14 may have resistance against an organic solvent. In addition, the bank layer 14 may have resistance against etching treatments and baking treatments. Examples of an electrically insulating material for the bank layer 14 are a negative-type photosensitive resin material such as polymide resin, acrylic resin, and novolac type phenolic resin.

[Functional Layer 15]

The functional layer 15 includes the hole transport layer 15a and the organic light-emitting layer 15b. In plan view, the functional layer 15 has an elongated shape. A thickness $T_0$ at the center of the functional layer 15 is, for instance, 80 nm.

The hole transport layer 15a is disposed between the hole injection layer 13 and the organic light-emitting layer 15b. The hole transport layer 15a improves efficiency of transportation of holes toward the organic light-emitting layer 15b. The hole transport layer 15a contains, for instance, a high-molecular material or a low-molecular material. Examples of such a high-molecular material and a low-molecular material are a copolymer including a fluorine unit and a triarylamine unit, or an amine-based material such as a low-molecular triarylamine derivative.

The organic light-emitting layer 15b is disposed on the hole transport layer 15a. When the organic light-emitting device 10 is driven, holes that the reflective anode 12 supply and electrons that the cathode 17 supply recombine with each other in the organic light-emitting layer 15b. This causes the organic light-emitting layer 15b to emit light. The organic light-emitting layer 15b contains an organic luminescent material and emits light of one of red, green, and blue. Examples of such an organic luminescent material are a high-molecular material such as polyfluorene, polyphenylene vinylene, polyacetylene, polyphenylene, polyparaphenylene ethylene, poly3-hexylthiophene, and derivative of these or fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, and rare earth metal complex.

[Electron Transport Layer 16]

The electron transport layer 16 is disposed between the organic light-emitting layer 15b and the cathode 17. The electron transport layer 16 improves efficiency of transportation of electrons toward the organic light-emitting layer 15b. The electron transport layer 16 contains, for instance, an alkali metal or an alkaline earth metal. Examples of such an alkali metal and an alkaline earth metal for the electron transport layer 16 are sodium (Na) and barium (Ba).

[Cathode 17]

The cathode 17 is disposed on the electron transport layer 16. The cathode 17 is an electrode supplying electrons to the organic light-emitting layer 15b. The cathode 17 contains an electrically conductive material through which visible light passes. Examples of such an electrically conductive material through which visible light passes are a thin film made of aluminum, a thin film made of an aluminum alloy, and indium tin oxide (ITO).

[Sealing Layer 18]

The sealing layer 18 is disposed on the cathode 17. The sealing layer 18 suppresses deterioration of the organic light-emitting layer 15b caused by intrusion of water and air into the organic light-emitting layer 15b. The sealing layer 18 contains a light-transmissive electrically insulating material through which water and air do not pass. Examples of such a light-transmissive electrically insulating material are silicon oxide (SiO), silicon nitride (SiN), silicon oxynitride (SiON), silicon carbide (SiC), silicon oxycarbide (SiOC), aluminum nitride (AlN), and aluminum oxide ($Al_2O_3$).

3. Manufacturing Method

The following describes a method for manufacturing the organic EL device 10, utilizing cross-sectional views in FIGS. 4A-4C, FIGS. 5A-5C, FIGS. 6A-6B, each taken along line A-A.

[From Substrate Preparation Step to Bank Forming Step]

Figure 4A:
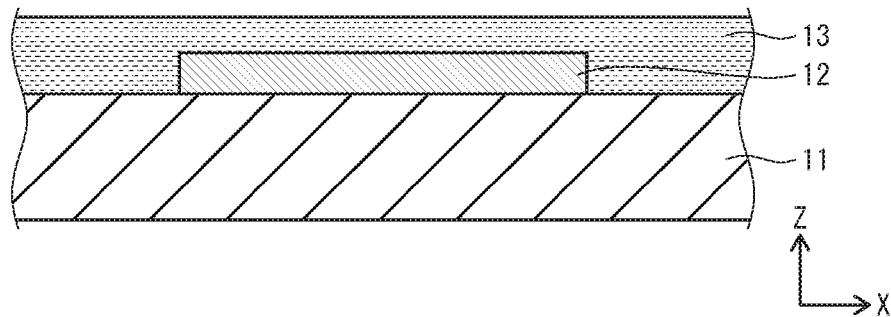
FIG. 4A is a cross-sectional view illustrating one example of processes of forming an anode and a hole injection layer on a substrate when manufacturing the organic EL device illustrated in FIG. 1.

As illustrated in FIG. 4A, the reflective anode 12 and the hole injection layer 13 are formed on the substrate 11. Specifically, the substrate 11 is prepared first. Next, the reflective anode 12 is formed on the substrate 11 by executing vacuum vapor deposition through a pattern mask. Then, the hole injection layer 13 is formed so as to cover both the substrate 11 and the reflective anode 12 by entirely executing vacuum vapor deposition.

Figure 4B:
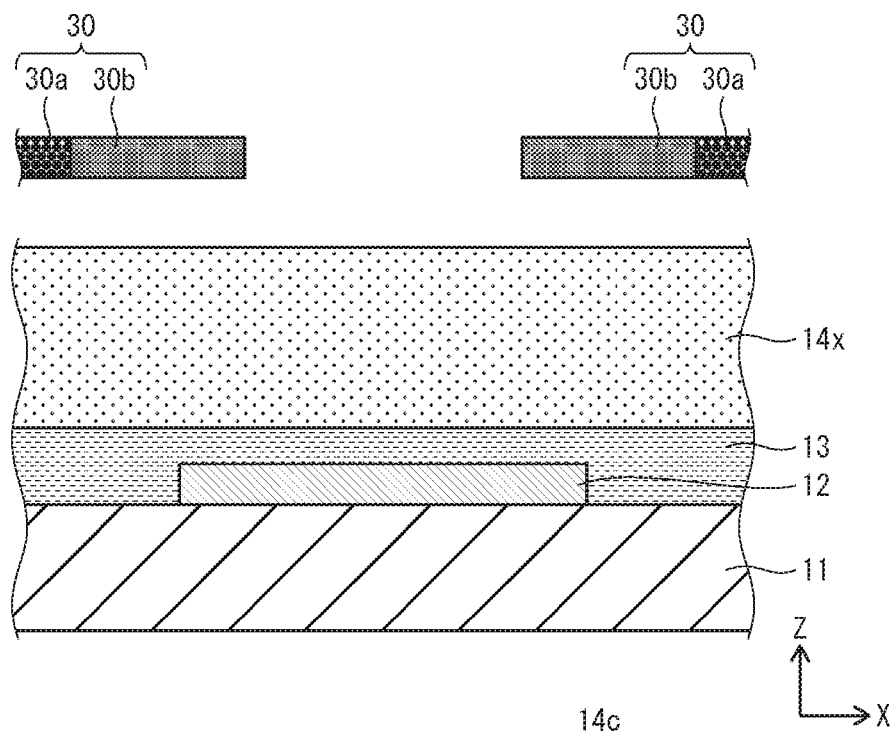
FIG. 4B is a cross-sectional view illustrating one example of processes of forming a resist layer on the hole injection layer and placing a pattern mask when manufacturing the organic EL device illustrated in FIG. 1.
Figure 4C:
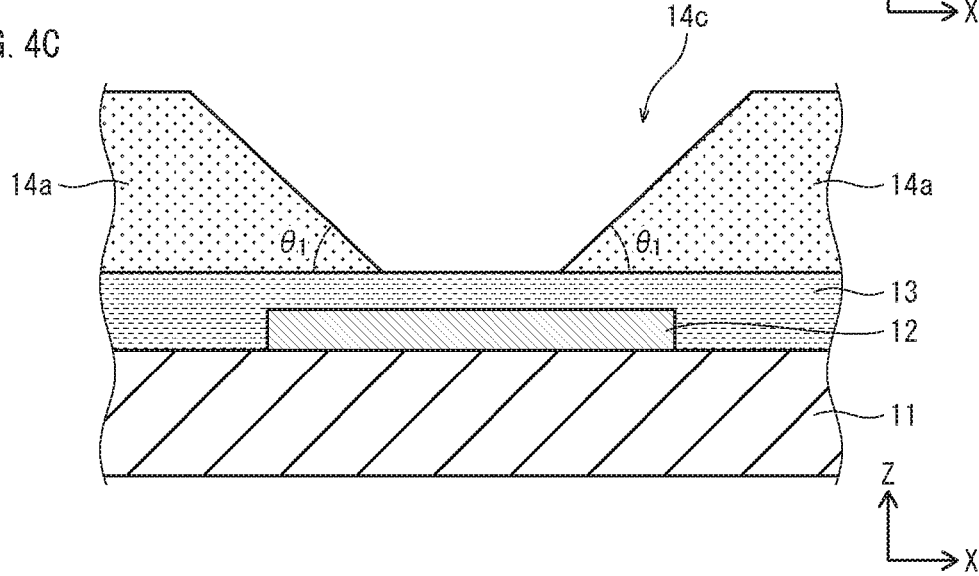
FIG. 4C is a cross-sectional view illustrating one example of a process of forming first banks when manufacturing the organic EL device illustrated in FIG. 1.

As illustrated in FIG. 4B, a resist layer 14X that is a material for the bank layer 14 is laminated on the hole injection layer 13. Further, a pattern mask 30 is placed over the resist layer 14X. Then, as illustrated in FIG. 4C, forming of the bank layer 14 is completed. Specifically, on the hole injection layer 13 formed on the substrate 11, the resist layer 14X made of a negative-type photosensitive material is uniformly laminated. Next, the pattern mask 30 is disposed over the resist layer 14X. The pattern mask 30 includes masking portions 30a that do not pass light at all and semi-translucent film portions 30b. Transmittance of the semi-translucent film portions 30b is adjusted in order to realize the angle θ1 between the inclined surface of the first bank 14a and the upper surface of the substrate 11. Then, the resist layer 14X is exposed to light through the pattern mask 30, based on photolithography. Further, developing is executed in order to form the bank layer 14 with an opening 14c. Meanwhile, the pattern mask 30 has the masking portions 30a, which do not pass light at all, and semi-translucent film portions 30c in the cross-section B-B (not illustrated). Transmittance of the translucent film portions 30c in the cross-section B-B is adjusted in order to realize the angle θ2 between the inclined surface of the second bank 14b and the upper surface of the substrate 11.

Meanwhile, typically, the greater the transmittance of the semi-translucent film portion 30b, the more obtuse the angle (π-θ1) of portions of the resist layer 14X that are removed. Also, the greater the transmittance of the semi-translucent film portion 30c, the more obtuse the angle (π-θ2) of portions of the resist layer 14X that are removed. Therefore, the angle θ1 between the first bank 14a and the upper surface of the substrate 11 can be made smaller than the angle θ2 between the second bank 14b and the upper surface of the upper surface of the substrate 11, by making the transmittance of the semi-translucent film portion 30b corresponding to the first bank 14a greater than the transmittance of the semi-translucent film portion 30c corresponding to the second bank 14b. Meanwhile, when utilizing a resist layer made of a positive-type photosensitive material, reversing the relationship of the transmittance of the semi-translucent film portion 30b and the transmittance of the semi-translucent film portion 30c can achieve the same result.

[From Functional Layer Forming Step to Sealing Layer Forming Step]

Figure 5A:
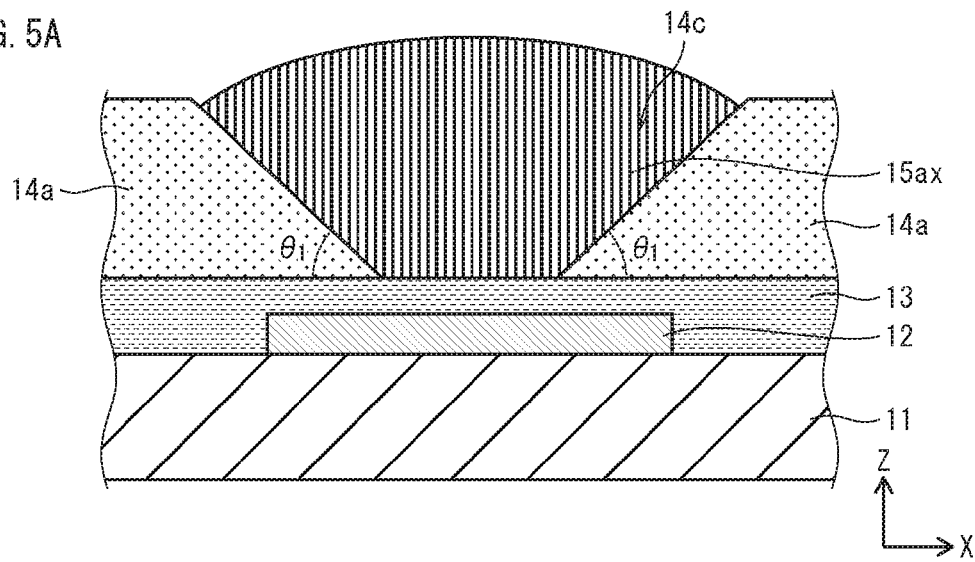
FIG. 5A is a cross-sectional view illustrating one example of a process of applying an ink including a hole transport material to an opening disposed between the first banks when manufacturing the organic EL device illustrated in FIG. 1.

As illustrated in FIG. 5A, an ink 15aX including a hole transport material and a solvent is applied to the opening 14c between the first banks 14a. The viscosity of the ink 15aX is, for instance, 5 cp.

Figure 5B:
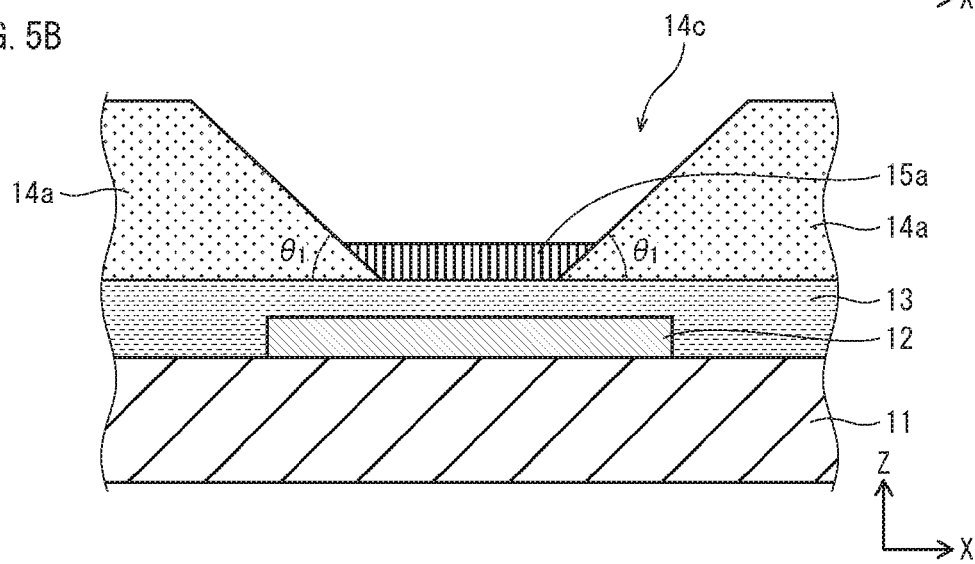
FIG. 5B is a cross-sectional view illustrating one example of a process of forming a hole transport layer when manufacturing the organic EL device illustrated in FIG. 1.

Next, as illustrated in FIG. 5B, forming of the hole transport layer 15a is completed. Specifically, evaporation of the solvent of the ink 15aX illustrated in FIG. 5A caused by drying of the ink 15aX forms the hole transport layer 15a.

Figure 5C:
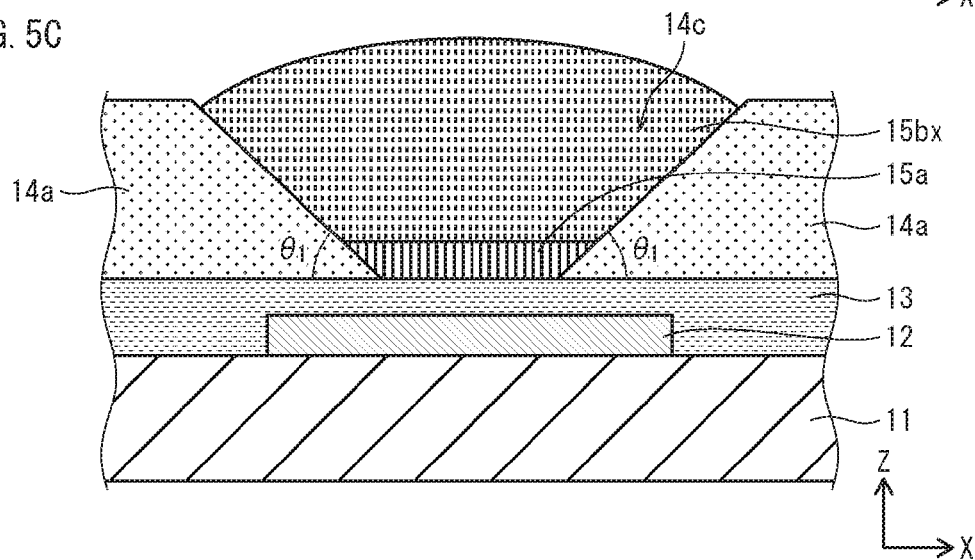
FIG. 5C is a cross-sectional view illustrating one example of a process of applying an ink including an organic luminescent material to the opening within the bank layer when manufacturing the organic EL device illustrated in FIG. 1.

Further, as illustrated in FIG. 5C, an ink 15bX including an organic luminescent material and a solvent is applied to the opening 14c between the first banks 14a. The viscosity of the ink 15bX is, for instance, 5 cp.

Figure 6A:
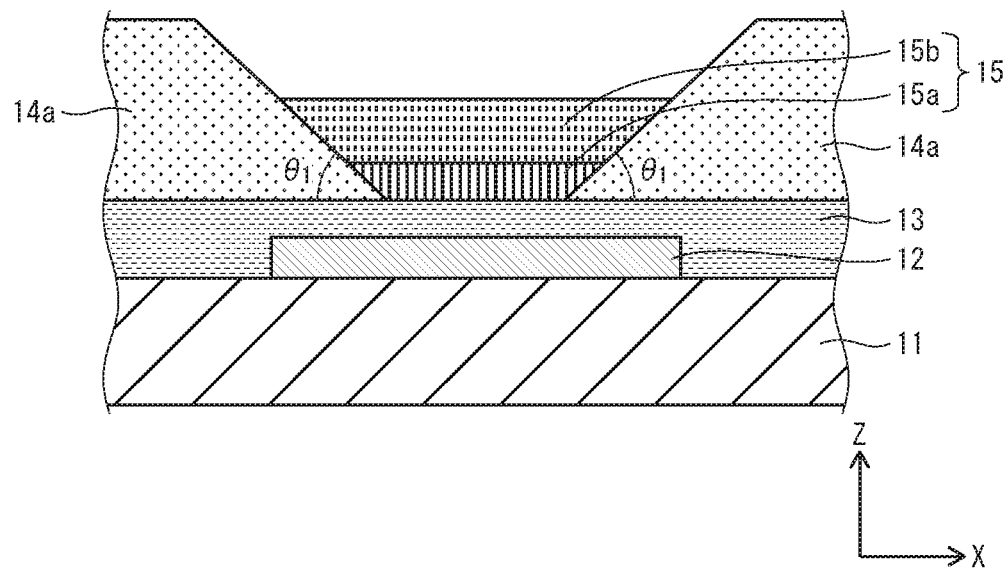
FIG. 6A is a cross-sectional view illustrating one example of a process of forming an organic light-emitting layer when manufacturing the organic EL device illustrated in FIG. 1.

Then, as illustrated in FIG. 6A, forming of the organic light-emitting layer 15b is completed. Specifically, drying the solvent of the ink 15bX illustrated in FIG. 5C forms the organic light-emitting layer 15b.

Figure 6B:
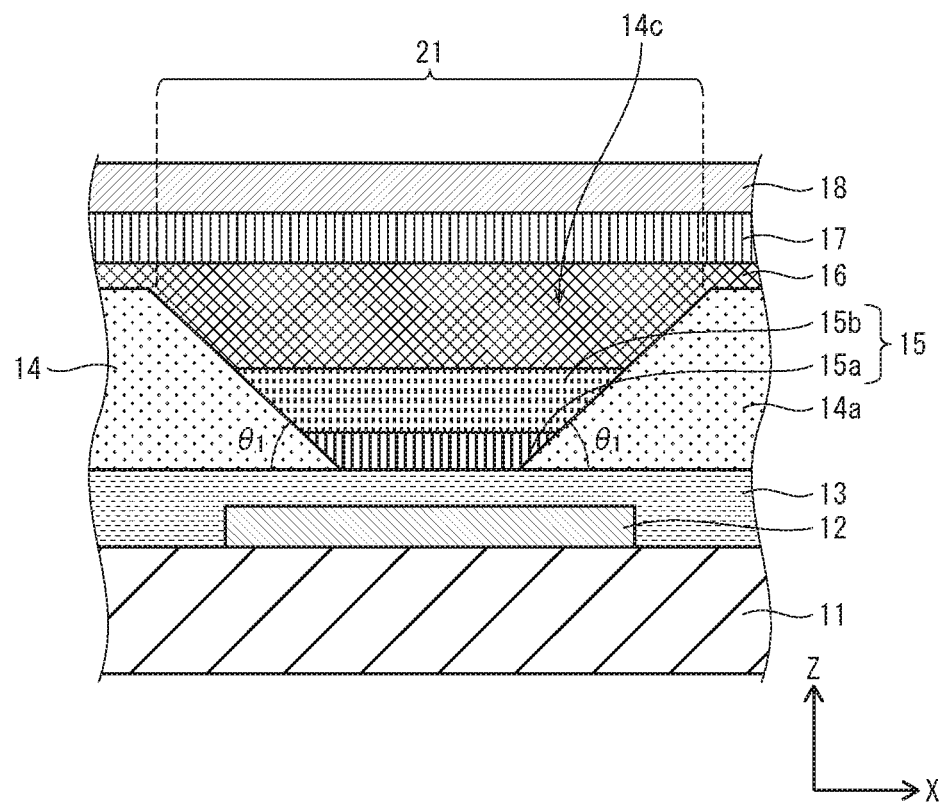
FIG. 6B is a cross-sectional view illustrating one example of processes of forming an electron transport layer, a cathode, and a sealing layer when manufacturing the organic EL device illustrated in FIG. 1.

Finally, as illustrated in FIG. 6B, the electron transport layer 16, the cathode 17, and the sealing layer 18 are formed in this order. The electron transport layer 16 and the cathode 17 can be made of, for instance, a metal with a low melting point such as sodium and aluminum. In such cases, sputtering or vacuum vapor deposition is utilized for forming the electron transport layer 16 and the cathode 17. For forming the sealing layer 18, sputtering, vacuum vapor deposition, or ink application, etc., is utilized.

The manufacturing processes as described above complete the forming of the organic EL device 10.

4. Experiment and Analysis

In the organic EL device 10, in which the inclined surface 14a1 of the first bank 14a and the upper surface of the substrate 11 forms the angle θ1 and the inclined surface 14b1 of the second bank 14b and the upper surface of the substrate 11 forms the angle θ2, the angle θ2 is greater than the angle θ1. In order to confirm the effect of making the angle θ2 greater than the angle θ1, five samples with different angles θ1 and different angles θ2 were manufactured, and an experiment was conducted in order to evaluate their performances. The results of the experiments are described below utilizing FIG. 7, FIG. 8A-8B, FIG. 9A-9B, FIG. 10, FIG. 11, and FIG. 12.

(Experiment)

Five samples (samples 1-5) of an organic EL device with different angles θ1 and different angles θ2 were manufactured by utilizing the method described above. In all of the five samples, the height of the first bank 14a and the second bank 14b was set to 1 μm. Further, the distance between adjacent first banks 14a was set to 64 μm, and the distance between adjacent second banks 14b was set to 254 μm. Also, the five samples were all designed so that thickness at the center of the organic light-emitting layer 15b was 80 nm.

Meanwhile, the ratio of the length of the subpixel region 21 in the transverse direction to the length of the subpixel region 21 in the longitudinal direction was set to 1:4. This ratio is typical for organic EL devices in which three subpixel regions each having an elongated shape constitute one pixel. The viscosity of an ink for forming the organic light-emitting layer 15b, including an organic luminescent material, was set to 5 cp. The amount of an ink applied was adjusted for each of the samples to realize the desired thickness (80 nm) at the center of the organic light-emitting layer 15b.

(Angle θ1, Angle θ2, and Thicknesses of End Portions of Organic Light-Emitting Layer)

First, for each of the samples 1-5, the thickness of a first end portion of the organic light-emitting layer 15b (end portion of the organic light-emitting layer 15b near the first bank 14a) and the thickness of a second end portion of the organic light-emitting layer 15b (end portion of the organic light-emitting layer 15b near the second bank 14b) were measured by using an atomic force microscope (AFM). The results are illustrated in FIG. 7, FIGS. 8A-8B, and FIGS. 9A-9B.

For each of the samples 1-5, FIG. 7 illustrates the angle θ1, the angle θ2, the thickness of the first end portion, and the thickness of the second end portion. As described above, the angle θ1 is the angle between the inclined surface 14a1 of the first bank 14a and the upper surface of the substrate 11. Also, the angle θ2 is the angle between the inclined surface 14b1 of the second bank 14b and the upper surface of the substrate 11. Further, the thickness of the first end portion refers to the thickness $T_1$ of the organic light-emitting layer 15b in FIG. 2. The thickness of the second end portion refers to the thickness $T_2$ of the organic light-emitting layer 15b in FIG. 3. Here, the thickness $T_1$ in FIG. 2 is measured at a position of the organic light-emitting layer 15b distant from an edge of the first bank 14a by 10% of the distance between edges of adjacent first banks 14a. The thickness $T_2$ in FIG. 3 is measured at a position of the organic light-emitting layer 15b distant from an edge of the second bank 14b by 3% of the distance between edges of adjacent second banks 14b. Further, the thickness of the first end portion was measured at the center of the organic light-emitting layer 15b in the longitudinal direction (Y-direction). Also, the thickness of the second end portion was measured at the center of the organic light-emitting layer 15b in the transverse direction (X-direction).

Figure 8A:
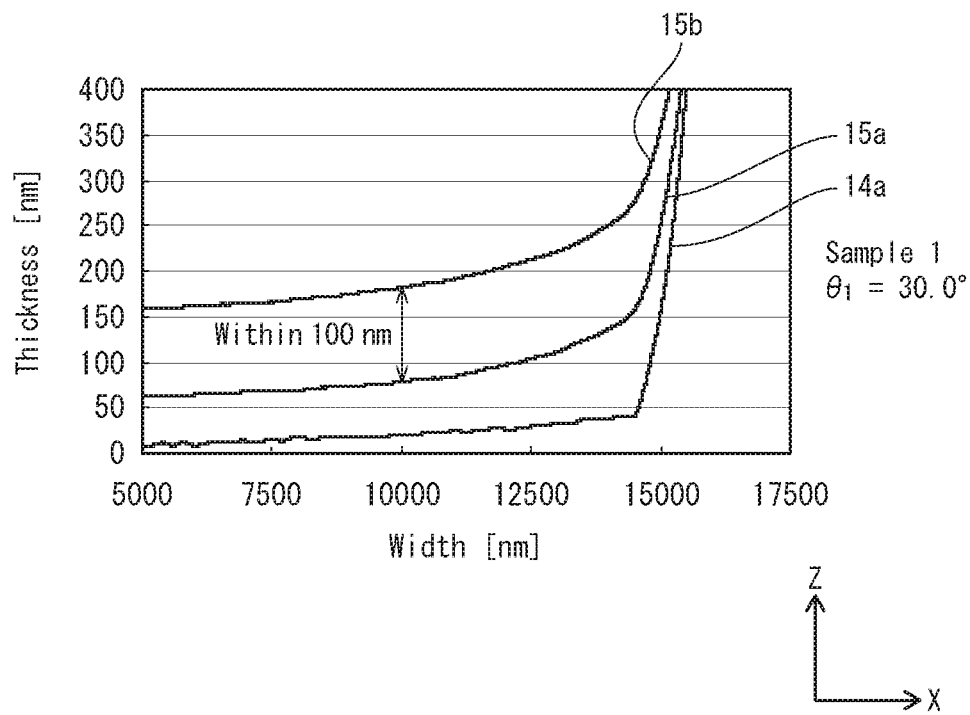
FIG. 8A and FIG. 8B illustrate results of executing measurement by using AFM at a position near the first bank of each of the organic EL devices illustrated in FIG. 7.
Figure 8B:
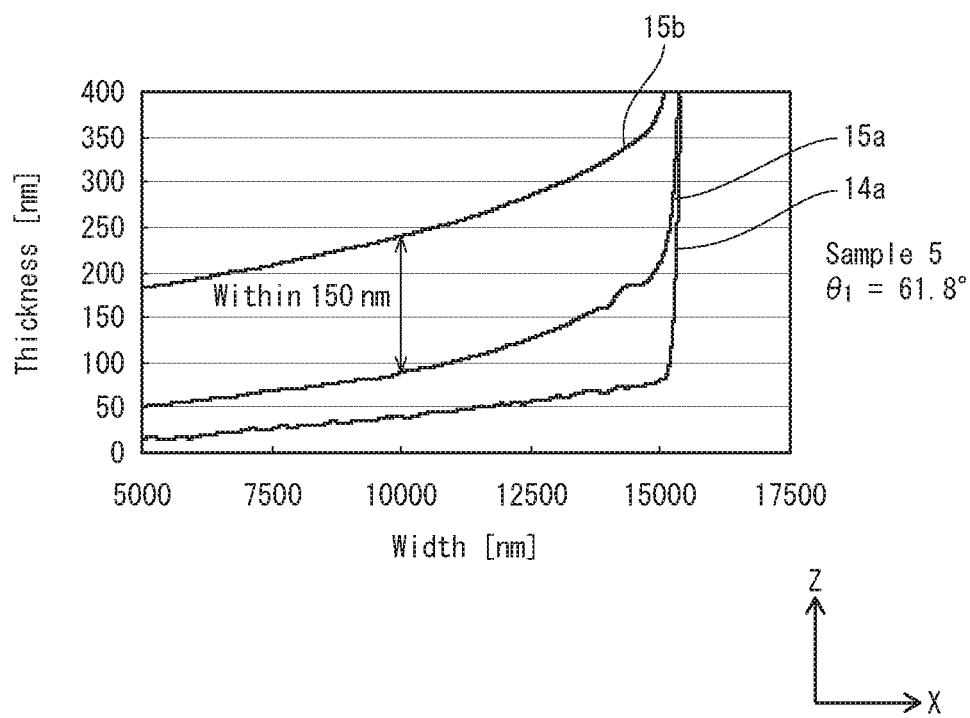

FIG. 8A and FIG. 8B illustrate results of measuring shapes of the edge of the first bank 14a, an end portion of the hole transport layer 15a, and an end portion of the organic light-emitting layer 15b in the sample organic EL devices by using AFM. FIG. 8A corresponds to sample 1 in which θ1=30.0°. FIG. 8B corresponds to sample 5 in which θ1=61.8°.

Figure 9A:
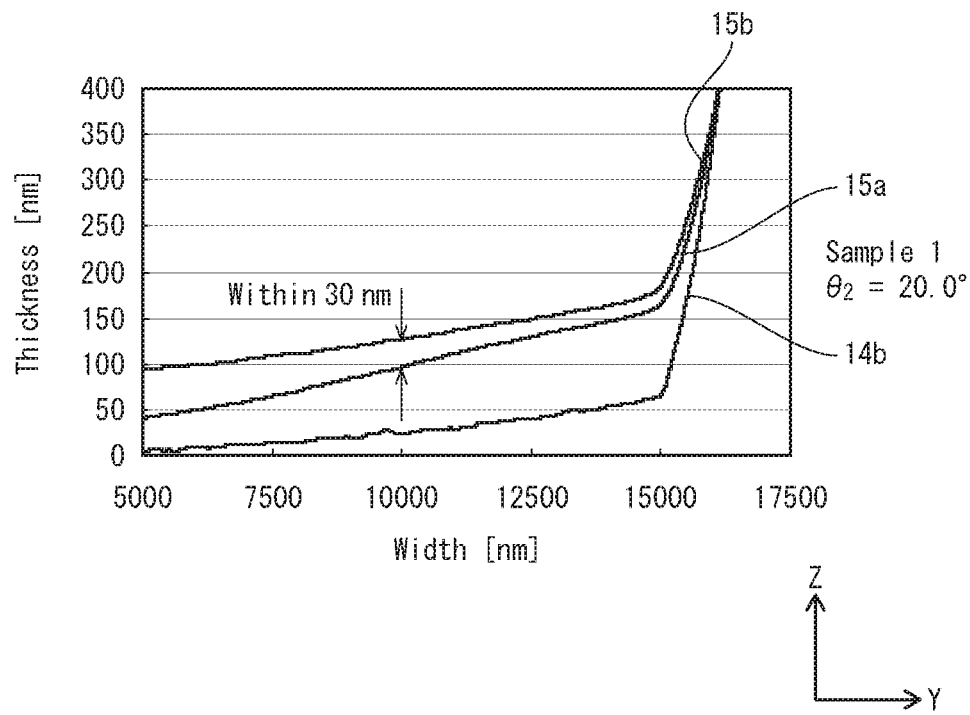
FIG. 9A and FIG. 9B illustrate results of executing measurement by using AFM at a position near the second bank of each of the organic EL devices illustrated in FIG. 7.
Figure 9B:
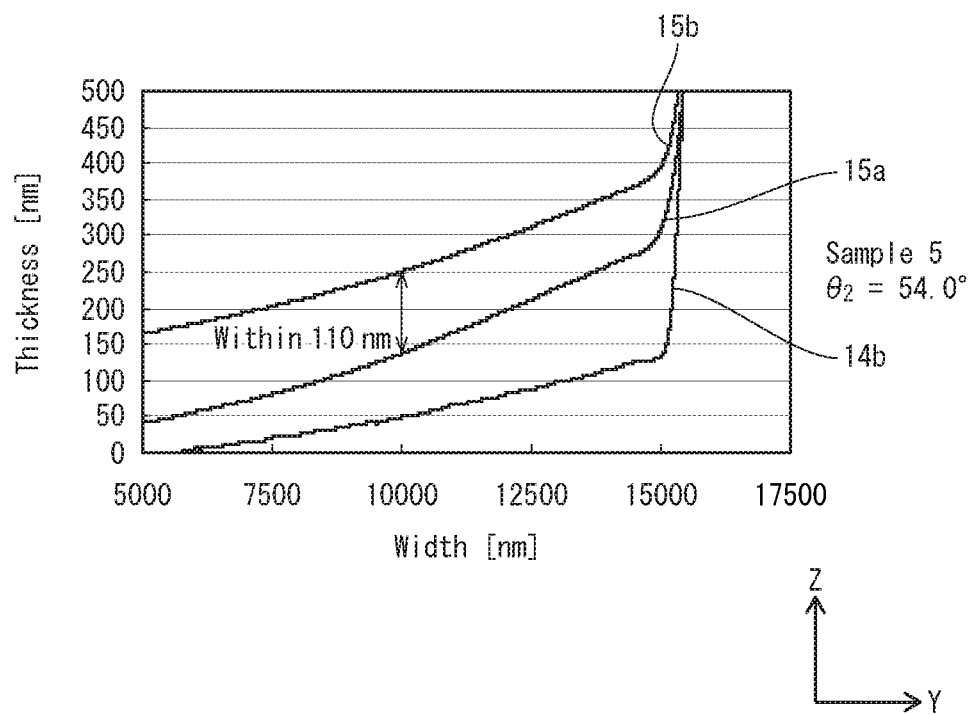

FIG. 9A and FIG. 9B illustrate results of measuring shapes of the edge of the second bank 14b, an end portion of the hole transport layer 15a, and an end portion of the organic light-emitting layer 15b in the sample organic EL devices by using AFM. FIG. 9A corresponds to sample 1 in which θ2=20.0°. FIG. 9B corresponds to sample 5 in which θ2=54.0°.

(1) Thickness of End Portion of Organic Light-Emitting Layer 15b near First Bank 14a First, the thickness of the first end portion is considered. As illustrated in FIG. 7, when the angle θ1 was 30.0°, 37.7°, 51.8°, 54.3°, and 61.8°, the thickness of the first end portion was 100 nm, 110 nm, 120 nm, 125 nm, and 150 nm, respectively. Also, when the angle θ1 was small, for instance, when θ1=30.0° as illustrated in FIG. 8A, the thickness of the first end portion was 100 nm. This value was close to the value of the desired thickness at the center of the organic light-emitting layer 15b, namely 80 nm. On the other hand, when the angle θ1 was large, for instance, when θ1=61.8° as illustrated in FIG. 8B, the thickness of the first end portion was 150 nm. This value differed greatly from the value of the desired thickness at the center of the organic light-emitting layer 15b, namely 80 nm.

(2) Thickness of End Portion of Organic Light-Emitting Layer 15b Near Second Bank 14b Next, the thickness of the second end portion is considered. As illustrated in FIG. 7, when the angle θ2 was 20.0°, 26.6°, 41.6°, 48.0°, and 54.0°, the thickness of the second end portion was 30 nm, 50 nm, 70 nm, 100 nm, and 110 nm, respectively. Also, when the angle θ2 was small, for instance, when θ2=20.0° as illustrated in FIG. 9A, the thickness of the second end portion was 30 nm. This value differed greatly from the value of the desired thickness at the center of the organic light-emitting layer 15b, namely 80 nm. On the other hand, when the angle θ2 was large, for instance, when θ1=54.0° as illustrated in FIG. 9B, the thickness of the second end portion was 110 nm. This value was close to the value of the desired thickness at the center of the organic light-emitting layer 15b, namely 80 nm.

(Analysis)

The following analyzes the angle θ1, the angle θ2, and the thicknesses of the end portions of the organic light-emitting layer.

When forming a functional layer by applying and drying an ink based on ink application in an opening surrounded by the first banks 14a and the second banks 14b, the solvent of the ink typically dries in a small amount of time after the ink application. Accordingly, the applied ink after spreads within the opening surrounded by the first banks 14a and the second banks 14b in a small amount of time. Further, a pinning position of the ink on each of the first bank 14a and the second bank 14b is dependent upon the height of the ink when the ink reaches each of the first bank 14a and the second bank 14b. Thus, the thickness of the first end portion and the thickness of the second end portion is dependent upon the pinning position of the ink on the first bank 14a and the second bank 14b, respectively.

Meanwhile, when an ink is applied to an elongated opening surrounded by the first banks 14a and the second banks 14b, surface tension of the applied ink tends to cause the surface of the applied ink to have a spherical shape. Further, typically, when an ink is applied to an elongated opening, the ink is applied to the center of the elongated opening. Here, when the angle θ1 equals the angle θ2, the applied ink first reaches the first banks 14a, and then reaches the second banks 14b. Within the time period from the arrival of the ink at the first banks 14a to the arrival of the ink at the second banks. 14b, the solvent included in the ink gradually evaporates. Because of this, the pinning position of the ink on the first bank 14a becomes higher than the pinning position of the ink on the second bank 14b.

By controlling the time period from the application of the ink to the arrival of the ink to the first banks 14a and the time period from the application of the ink to the arrival of the ink at the second banks 14b, the difference in thickness of the first end portion and the second end portion can be suppressed. Specifically, lengthening the time period from the application of the ink to the arrival of the ink at the first banks 14a and shortening the time period from the application of the ink to the arrival of the ink at the second banks 14b can achieve the desired result. One possible method for executing such a control is, for instance, to change the ratio of the length of the opening in the transverse direction in plan view to the length of the opening in the longitudinal direction in plan view. However, such a configuration is difficult to realize, because an organic EL device needs to have a light-emitting region of a certain size.

In view of this, the present disclosure adopts the method of making the angle θ2 between the inclined surface 14b1 of the second bank 14b and the upper surface of the substrate 11a greater than the angle θ1 between the inclined surface 14a1 of the first bank 14a and the upper surface of the substrate 11a. It is considered that the results illustrated in FIG. 7 (i.e., the thickness of the first end portion was greater than the thickness of the second end portion) was obtained through this method. According to this, it can be seen that making the angle θ2 greater than the angle θ1 achieves suppression of the difference between the thickness of the first end portion and the thickness of the second end portion.

(Possible Values and Ranges of Angle θ1 and Angle θ2)

Taking into account the above analysis, possible values of the angle θ1 and the angle θ2 were examined.

Figure 10:
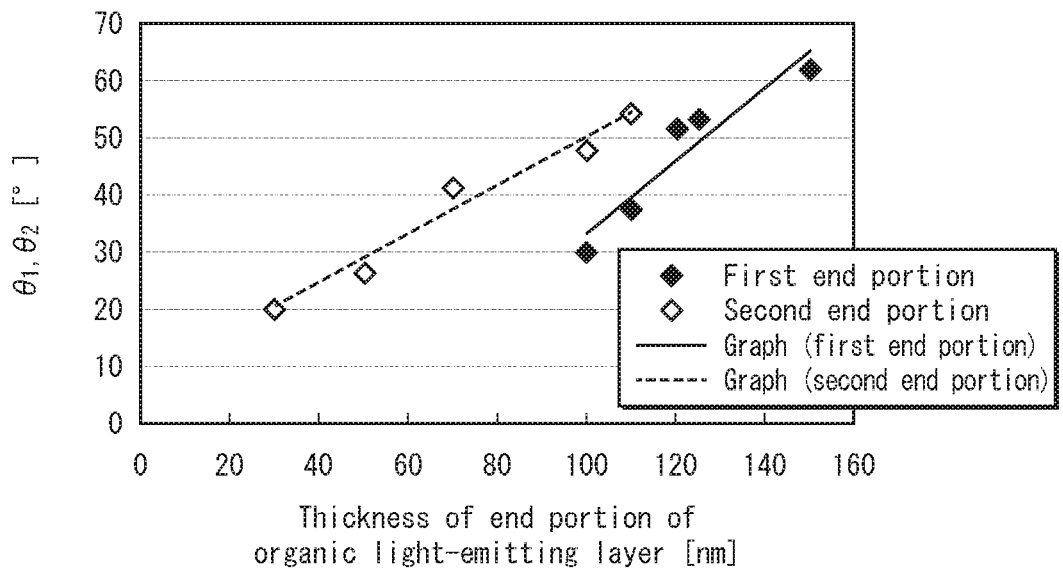
FIG. 10 includes graphs related with the organic EL devices illustrated in FIG. 7. One graph illustrates a relationship between thicknesses of the end portion of the functional layer near the first bank and the angles between the inclined surface of the first bank and the upper surface of the substrate. The other graph illustrates a relationship between the thicknesses of the end portion of the functional layer near the second bank and the angles between the inclined surface of the second bank and the upper surface of the substrate.

FIG. 10 includes graphs illustrating how the thickness of the first end portion and the thickness of the second end portion differ for different angles θ1 and different angles θ2 of the samples 1-5. One graph corresponds to the first bank 14a and is drawn by plotting the thicknesses of the first end portions for the different angles θ1 in samples 1-5. The other graph corresponds to the second bank 14b and is drawn by plotting the thicknesses of the second end portions for the different angles θ2 in the samples 1-5. The horizontal axis of FIG. 10 indicates the thicknesses of the first end portions and the thicknesses of the second end portions in the samples 1-5 illustrated in FIG. 7. The vertical axis of FIG. 10 indicates angles θ1 between the inclined surface of the first bank and the upper surface of the substrate and angles θ2 between the inclined surface of the second bank and the upper surface of the substrate in the samples 1-5 illustrated in FIG. 7.

When the angle θ1 and the angle θ2 have the same value, the thickness of the first end portion becomes greater than the thickness of the second end portion. Accordingly, making the angle θ2 greater than the angle θ1 achieves suppression of the difference between the thickness of the first end portion and the thickness of the second end portion.

The following is a detailed analysis of the relationship between the angle θ1 and the angle θ2.

The following primary expression is derived from the two graphs illustrated in FIG. 10.

[Math 3]

$$\theta 1 = 0.6401 \times T_1 - 30.5290 \quad \text{(Formula 1)}$$

[Math 4]

$$\theta 2 = 0.4213 \times T_2 + 7.7036 \quad \text{(Formula 2)}$$

First, utilizing Formula 1 and Formula 2, possible ranges of the angle θ1 and the angle θ2 are examined. Here, $T_1$ and $T_2$ are set to satisfy, for instance, $T_2 = T_1 \pm 10$. In other words, $T_1$ and $T_2$ are set to values sufficiently close to one another.

Here, Formula 1 is rearranged as follows.

[Math 5]

$$T_1 = (\theta 1 + 30.5290)/0.6401 \quad \text{(Formula 1')}$$

Utilizing Formula 1', the following equation is set up.

$$T_2 = T_1 \pm 10 = (\theta 1 + 30.5290)/0.6401 \pm 10 \quad \text{[Math 6]}$$

Substituting the above equation for $T_2$ in Formula 2 derives the following range.

[Math 7]

$$(0.6582 \times \theta 1 + 23.6000) \leq \theta 2 \leq (0.6582 \times \theta 1 + 32.0100) \quad \text{(Formula 3)}$$

Meanwhile, substituting $T_1 \pm 10$ for $T_2$ in Formula 2 and subtracting Formula 1 from Formula 2 derives the following range.

[Math 8]

$$(\theta 1 + (32.0196 - 0.2188 \times T_1)) \leq \theta 2 \leq (\theta 1 + (42.4456 - 0.2188 \times T_1)) \quad \text{(Formula 4)}$$

Thus, when the angle θ1 and the angle θ2 are set within the range of Formula 3 and Formula 4, the difference between the thickness of the first end portion and the thickness of the second end portion can be suppressed to equal to or below 10 nm.

Further, setting $T_1$ and $T_2$ to satisfy $T_1 = T_2$ and subtracting Formula 1 from Formula 2 derives the following primary expression.

[Math 9]

$$\theta 2 = \theta 1 + (38.2000 - 0.2180 \times T_1) \quad \text{(Formula 5)}$$

By substituting the thickness at the center of the organic light-emitting layer for $T_1$ and a given angle for the angle θ1 in Formula 5, the angle θ2 can be calculated. That is, when the angle θ1 and the angle θ2 satisfy Formula 5, the thickness of the first end portion and the thickness of the second end portion equal each other.

The following examines the thicknesses of the end portions of the organic light-emitting layers in an organic EL devices and the light emission efficiency of the organic EL devices by utilizing results of experiments.

(Thickness of End Portion of Organic Light-Emitting Layer near Second Bank and Light Emission Efficiency)

First, a plurality of sample organic EL devices were prepared so that the angle θ2 between the inclined surface of the second bank and the surface of the substrate differs between the sample organic EL devices. Then an IVL measurement was executed for each of the organic EL devices. An IVL measurement is an experiment for measuring luminance L relative to a current I and a voltage V. From the result of the IVL measurement, light emission efficiency of the organic EL devices can be obtained.

Figure 11:
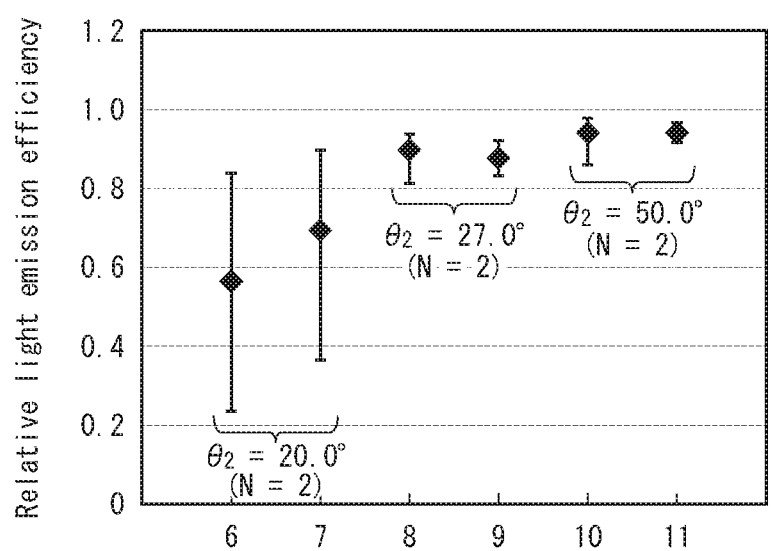
FIG. 11 illustrates how light emission efficiencies of the organic EL devices illustrated in FIG. 7 differ for the angle between the inclined surface of the second bank and the upper surface of the substrate differing between the sample organic EL devices.

FIG. 11 includes graphs indicating the results of the IVL measurement. The horizontal axis of FIG. 11 indicates sample numbers identifying the sample organic EL devices, and the vertical axis indicates relative light emission efficiencies of the sample organic EL devices. Here, a relative light emission efficiency of a sample organic EL device indicates the light emission efficiency of the sample organic EL device relative to a light emission efficiency (1) of an organic EL device formed by spin coating.

The relative light emission efficiencies of samples 6 and 7 in which θ2=20.0° were 0.59 and 0.70, respectively. The values of relative light emission efficiency of samples 8 and 9 in which θ2=27.0° were 0.90 and 0.85, respectively. The relative light emission efficiencies of samples 10 and 11 in which θ2=50.0° were both 0.95. As such, the greater the angle θ2 between the inclined surface of the second bank and the upper surface of the substrate, the higher the relative light emission efficiency (increasing from 0.59 to 0.95). That is, an increase in the angle θ2 between the inclined surface of the second bank and the upper surface of the substrate improves relative light emission efficiency of an organic EL device. The following examines this in detail.

In sample organic EL devices where the angle θ2 was small, the thickness of the second end portion unfortunately was smaller than the desired thickness at the center of the organic light-emitting layer. This configuration causes concentration of current in the second end portion when the organic light-emitting layer emits light. Such concentration of current may have deteriorated the organic light-emitting layers in the relevant sample organic EL devices and resulted in low relative light emission efficiencies of the relevant sample organic EL devices. On the other hand, in sample organic EL devices where the angle θ2 was large, the thickness of the second end portion was close to the desired thickness at the center of the organic light-emitting layer. This configuration suppresses concentration of current in the second end portion when the organic light-emitting layer emits light. Accordingly, deterioration of organic light-emitting layer is suppressed, and the relevant sample organic EL devices can have high relative light emission efficiency.

(Thickness of End Portion of Organic Light-Emitting Layer Near First Bank and Light-Emitting Life of Organic Light-Emitting Layer)

First, a plurality of sample organic EL devices were prepared so that the angle θ1 between the inclined surface of the first bank and the surface of the substrate differs between the sample organic EL devices. Then, a light-emitting life of each of the plurality of the sample organic EL devices were examined.

Figure 12:
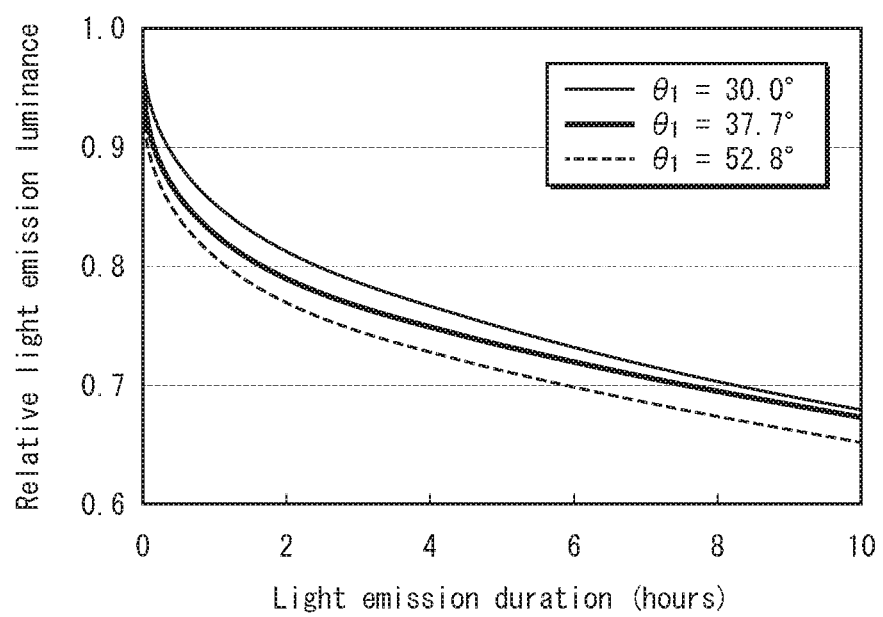
FIG. 12 illustrates how light-emitting lives of the organic EL devices illustrated in FIG. 7 differ for the angle between the inclined surface of the first bank and the upper surface of the substrate differing between the sample organic EL devices.

The length of the light-emitting life of a sample organic EL device can be calculated from relative light emission luminance of the sample organic EL device in relation to cumulative light emission duration of the sample organic EL device. The relative light emission luminance is a ratio of the light emission luminance after a certain light emission duration has elapsed to the light emission luminance when the light emission duration is zero hour. FIG. 12 includes graphs illustrating the results of examination of light-emitting life. The horizontal axis indicates the light emission duration, and the vertical axis indicates the relative light emission luminances of the sample organic EL devices.

When θ1=30.0°, in cases where the light emission duration was 2 hours, 4 hours, 6 hours, 8 hours, and 10 hours, the relative light emission luminance was 0.82, 0.76, 0.74, 0.71, and 0.68, respectively. When θ1=37.7°, in cases where the light emission duration was 2 hours, 4 hours, 6 hours, 8 hours, and 10 hours, the relative light emission luminance was 0.79, 0.75, 0.72, 0.69, and 0.67, respectively. When θ1=52.8°, in cases where the light emission duration was 2 hours, 4 hours, 6 hours, 8 hours, and 10 hours, the relative light emission luminance was 0.78, 0.72, 0.70, 0.68, and 0.65, respectively. Thus, the greater the angle θ1, the lower the relative light emission luminance after the same light emission duration. That is, the greater the angle θ1 between the inclined surface of the first bank and the upper surface of the substrate, the shorter the light-emitting life of an organic EL device. Accordingly, an assumption can be made that making the angle θ1 small improves the light-emitting life of an organic EL device. The following examines this in detail.

In sample organic EL devices where the angle θ1 was large, the thickness of the first end portion unfortunately was greater than the desired thickness at the center of the organic light-emitting layer. This configuration causes concentration of current at the center of the organic light-emitting layers in the relevant sample organic EL devices when the organic light-emitting layer emits light. Such concentration of current may have deteriorated the organic light-emitting layer and resulted in short light-emitting lives of the relevant sample organic EL devices. On the other hand, in sample organic EL devices where the angle θ1 was small, the thickness of the first end portion was close to the desired thickness at the center of the organic light-emitting layer. This configuration suppresses concentration of current at the center of the organic light-emitting layer when the organic light-emitting layer emits light. Accordingly, deterioration of the organic light-emitting layer is suppressed, and the relevant sample organic EL devices can have long light-emitting life.

5. Effects

In the organic EL device 10, which has the elongated subpixel region 21, the angle θ2 between the inclined surface of the second bank 14b and the upper surface of the substrate is greater than the angle θ1 between the inclined surface of the first bank 14a and the upper surface of the substrate. Accordingly the difference between the thickness of the first end portion and the thickness of the second end portion of the functional layer 15 formed by ink application can be suppressed.

<Modification>

1. Controlling Taper Angle of Bank

In the above embodiment, the angle between the inclined surface of the first bank and the upper surface of the substrate and the angle between the inclined surface of the second bank and the upper surface of the substrate are controlled by utilizing a halftone mask, but the present disclosure should not be construed as being limited to this. For instance, the angle between the inclined surface of the second bank and the upper surface of the substrate may be made small by utilizing a halftone mask covering only the inclined surface of the second bank. This configuration enables enlarging the thickness of the second end portion and thereby suppressing the difference between the thickness of the first end portion and the thickness of the second end portion. Further, in this configuration, interference between a light beam transmitted from a portion of the halftone mask covering the first bank and a light beam transmitted from a portion of the halftone mask covering the second bank adjacent to the first bank, that would otherwise occur, does not occur during an exposure process. Accordingly, the first bank and the second bank can be formed appropriately.

2. Method for Forming First Bank and Second Bank

In the above embodiment, the first bank and the second bank are formed by utilizing a halftone mask, but the present disclosure should not be construed as being limited to this. That is, for instance, the first bank and the second bank can be formed by photolithography utilizing, for instance, a gray tone mask, a slit mask, or a stack-layered mask.

3. Method for Manufacturing Functional Layer

The above embodiment illustrates an example in which the hole transport layer and the organic light-emitting layer are formed by ink application, but the present disclosure should not be construed as being limited to this. For instance, the hole transport layer may be formed by vapor deposition, and the organic light-emitting layer may be formed by ink application. Further, for instance, the hole transport layer may be formed by ink application, and the organic light-emitting layer may be formed by vapor deposition.

4. Application of Present Invention

The organic EL device of the present disclosure can be applied to, for instance, organic EL display panels. An organic EL display panel can be mounted in a television system combined with an audio device. Unlike liquid crystal displays (LCD), organic EL display panels do not require backlights. Accordingly, organic EL display panels can be thinned with ease, and show outstanding characteristics in designing systems.

5. Other Issues

Configurations of the components of the present disclosure should not be construed as being limited to the above embodiment. For instance, instead of a hole transport layer, an intermediate layer (IL) may be utilized.

Further, the above embodiment illustrates a case in which ink application is used for forming the hole transport layer and the organic light-emitting layer, but the present disclosure should not be construed as being limited to this. For instance, depending upon material configuration, the present disclosure is applicable to cases where ink application is used for forming the hole injection layer, etc.

INDUSTRIAL APPLICABILITY

The present disclosure is applicable as a method for manufacturing, for instance, an organic EL device usable for a display device such as a display for a mobile telephone or a television, and for a light source of various types. The present disclosure provides a method of manufacturing an organic EL device and an organic EL display panel that are capable of exhibiting excellent light emission efficiency and image display performance, regardless of the specific use thereof.

REFERENCE SIGNS LIST 10 organic EL device
11 TFT substrate
12 reflective anode
13 hole injection layer
14a first bank
14b second bank
14c opening
15 functional layer
15a hole transport layer
15b organic light-emitting layer
16 electron transport layer
17 cathode
18 sealing layer

The invention claimed is:

1. An organic electroluminescence device, comprising:
a substrate;
a bank layer disposed on the substrate and having an opening, the opening, in a plan view, having a shorter length in a first direction than in a second direction, and the first direction and the second direction crossing each other; and
a functional layer disposed within the opening and containing an organic material, the functional layer, in a plan view, having a shorter length in the first direction than in the second direction, wherein
the bank layer includes:
two first banks opposing each other in the first direction with the functional layer between the two first banks and extending along the second direction; and
two second banks opposing each other in the second direction with the functional layer between the two second banks and extending along the first direction,
inner wall surfaces of the first banks and the second banks surround the functional layer and define the opening, each of the inner wall surfaces being inclined, and
the inclined inner wall surface of each of the second banks forms an angle θ2 with an upper surface of the substrate, and each of the inclined inner wall surfaces of the first banks forms an angle θ1 smaller than the angle θ2 with the upper surface of the substrate,
the angle θ1 and the angle θ2 satisfy:

$$(0.6582 \times \theta 1 + 23.6000) \leq \theta 2 \leq (0.6582 \times \theta 1 + 32.0100).$$

2. The organic electroluminescence device of claim 1, wherein
the organic material is a hole transport material.

3. The organic electroluminescence device of claim 1, wherein
the first banks and the second banks are provided by a photolithography utilizing one of a halftone mask, a gray tone mask, and a slit mask.

4. The organic EL electroluminescence device of claim 1, wherein
the functional layer is provided by applying and drying an ink containing the organic material.

5. An organic electroluminescence device, comprising:
a substrate;
a bank layer disposed on the substrate and having an opening, the opening, in a plan view, having a shorter length in a first direction than in a second direction, and the first direction and the second direction crossing each other; and
a functional layer disposed within the opening and containing an organic material, the functional layer, in a plan view, having a shorter length in the first direction than in the second direction, wherein the bank layer includes:
two first banks opposing each other in the first direction with the functional layer between the two first banks and extending along the second direction; and
two second banks opposing each other in the second direction with the functional layer between the two second banks and extending along the first direction,
inner wall surfaces of the first banks and the second banks surround the functional layer and define the opening, each of the inner wall surfaces being inclined, and
the inclined inner wall surface of each of the second banks forms an angle θ2 with an upper surface of the substrate, and each of the inclined inner wall surfaces of the first banks forms an angle θ1 smaller than the angle θ2 with the upper surface of the substrate,
when a thickness of the functional layer at a position closer to one of the first banks than to a center of the functional layer between the first banks is $T_1$ nm, the angle θ1 and the angle θ2 satisfy:

$$(\theta 1+(34.0196-0.2188 \times T_1)) \leq \theta 2 \leq (\theta 1+(42.4456-0.2188 \times T_1)).$$

6. The organic electroluminescence device of claim 5, wherein
the organic material is a hole transport material.

7. The organic electroluminescence device of claim 5, wherein
the first banks and the second banks are provided by a photolithography utilizing one of a halftone mask, a gray tone mask, and a slit mask.

8. The organic electroluminescence device of claim 5, wherein
the functional layer is provided by applying and drying an ink containing the organic material.

* * * * *